United States Patent [19]
Keeth

[11] Patent Number: 5,872,736
[45] Date of Patent: *Feb. 16, 1999

[54] HIGH SPEED INPUT BUFFER

[75] Inventor: Brent Keeth, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 738,529

[22] Filed: Oct. 28, 1996

[51] Int. Cl.$^6$ ..................................................... G11C 7/00
[52] U.S. Cl. .................... 365/189.05; 365/207; 365/205; 326/83
[58] Field of Search ............................... 365/189.05, 207, 365/205, 149; 326/83; 327/52, 96; 395/872

[56] References Cited

U.S. PATENT DOCUMENTS

| | | | |
|---|---|---|---|
| 4,096,402 | 6/1978 | Schroeder et al. | 307/362 |
| 4,404,474 | 9/1983 | Dingwall | 307/260 |
| 4,638,187 | 1/1987 | Boler et al. | 307/451 |
| 4,789,796 | 12/1988 | Foss | 307/443 |
| 4,958,088 | 9/1990 | Farah-bakhsh et al. | 307/443 |
| 4,984,204 | 1/1991 | Sato et al. | 365/189.11 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,220,208 | 6/1993 | Schenck | 307/443 |
| 5,239,206 | 8/1993 | Yanai | 307/272.2 |
| 5,243,703 | 9/1993 | Farmwald et al. | 395/325 |
| 5,254,883 | 10/1993 | Horowitz et al. | 307/443 |
| 5,274,276 | 12/1993 | Casper et al. | 307/443 |
| 5,276,642 | 1/1994 | Lee | 365/189.04 |
| 5,278,460 | 1/1994 | Casper | 307/296 |
| 5,281,865 | 1/1994 | Yamashita et al. | 307/279 |
| 5,311,481 | 5/1994 | Casper et al. | 365/230.06 |
| 5,321,368 | 6/1994 | Hoelzle | 328/63 |
| 5,347,177 | 9/1994 | Lipp | 307/443 |
| 5,347,179 | 9/1994 | Casper et al. | 307/451 |

(List continued on next page.)

FOREIGN PATENT DOCUMENTS

| | | |
|---|---|---|
| 0450871 | 10/1991 | European Pat. Off. . |
| 0655741 | 5/1995 | European Pat. Off. . |
| 0680049 | 11/1995 | European Pat. Off. . |
| 2-112317 | 4/1990 | Japan . |
| 4-135311 | 8/1992 | Japan . |
| 5-136664 | 1/1993 | Japan . |
| 05282868 | 10/1993 | Japan . |
| 96/10866 | 4/1996 | WIPO . |

OTHER PUBLICATIONS

Chapman, et al., "A Low–Cost High–Performance CMOS Timing Vernier for ATE", *IEEE International Test Conference*, 459–468, (1995).

Lijuslin, et al., "An Integrated 16–channel CMOS Time to Digital Converter", *Nuclear Science Symposium & Medical Imaging Conference* vol. 1, IEEE Conference Record, 625–629, (1993).

Taguchi, et al., "A 40–ns 64–Mb DRAM with 64–b Parallel Data Bus Architecture", *IEEE J. Solid–State Circuit*, 26, 1493–1497, (Nov. 1991).

*Primary Examiner*—David Nelms
*Assistant Examiner*—Huan Hoang
*Attorney, Agent, or Firm*—Seed and Berry LLP

[57] ABSTRACT

A data bus is described which has integrated circuits, such as memory circuits, coupled thereto. The integrated circuits include an input buffer circuit adapted to receive and latch high speed data transmissions. The input buffer circuit equilibrates a sensing circuit, samples input data, senses the sampled input data, and latches the sensed data during different phases of an input clock cycle. An input buffer circuit is described which has two receiver circuits for receiving data transmissions having a higher speed data transmissions.

21 Claims, 7 Drawing Sheets

U.S. PATENT DOCUMENTS

| | | | |
|---|---|---|---|
| 5,355,391 | 10/1994 | Horowitz et al. | 375/36 |
| 5,361,002 | 11/1994 | Casper | 327/530 |
| 5,400,283 | 3/1995 | Raad | 365/203 |
| 5,426,610 | 6/1995 | Childers et al. | 365/207 X |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,444,662 | 8/1995 | Tanaka et al. | 365/205 X |
| 5,451,898 | 9/1995 | Johnson | 327/53 |
| 5,457,407 | 10/1995 | Shu et al. | 326/30 |
| 5,473,575 | 12/1995 | Farmwald et al. | 365/230.06 |
| 5,485,490 | 1/1996 | Leung et al. | 375/371 |
| 5,488,321 | 1/1996 | Johnson | 327/66 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farnwald et al. | 395/309 |
| 5,568,077 | 10/1996 | Sato et al. | 327/199 |
| 5,574,698 | 11/1996 | Raad | 365/230.06 |
| 5,576,645 | 11/1996 | Farwell | 327/94 |
| 5,578,941 | 11/1996 | Sher et al. | 326/34 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,615,161 | 3/1997 | Mu | 365/189.05 X |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,636,391 | 6/1997 | Seyyedy | 365/205 |
| 5,638,335 | 6/1997 | Akiyama et al. | 365/230.03 |
| 5,650,971 | 7/1997 | Longway et al. | 365/207 |
| 5,668,763 | 9/1997 | Fujioka et al. | 365/200 |
| 5,694,065 | 12/1997 | Hamasaki et al. | 327/108 |

HIGH SPEED INPUT BUFFER

TECHNICAL FIELD OF THE INVENTION

The present invention relates generally to integrated circuits and in particular the present invention relates to data input buffers capable of receiving high speed data transmissions.

BACKGROUND OF THE INVENTION

Integrated circuits typically include a number of input/output pins which are used for communication with additional circuitry. For example, an integrated memory device such as a dynamic random access memory (DRAM) includes both control inputs for receiving memory operation control signals, and data pins for bi-directional data communication with an external system or processor.

The data transmission rate of modern integrated circuits is primarily limited by internal circuitry operating speeds. That is, communication networks have been developed which can transmit signals between circuitry at a rate that is faster than the capacity of many integrated circuits. To address the need for faster circuits, a group of integrated circuits can be combined on a common bus. In this configuration, each integrated circuit operates in a coordinated manner with the other integrated circuits to share data which is transmitted at a high speed. For example, a group of memory devices, such as DRAMs, static RAMs, or read only memories (ROM), can be connected to a common data bus. The data rate of the bus may be substantially faster than the feasible operating speed of the individual memories. Each memory, therefore, is operated so that while one memory is processing received data, another memory is receiving new data. By providing an appropriate number of memory devices and an efficient control system, very high speed data transmissions can be achieved.

As the transmission rate of the data communication signals continues to increase, new circuitry and methods are needed to accurately receive data at each integrated circuit. One proposed solution is a bus interface described in U.S. Pat. No. 5,513,327. This bus interface uses two edge triggered receivers to latch data. The first receiver operates in response to a rising edge of a clock signal while the second receiver operates in response to the falling edge of the clock. Further, the data bus is not terminated at a midsupply level and output is transmitted on the bus using an open drain configuration.

For the reasons stated above, and for other reasons stated below which will become apparent to those skilled in the art upon reading and understanding the present specification, there is a need in the art for a high speed input buffer which can operate independently, or in combination with another input buffer, to receive data in response to a transition of a bus clock.

SUMMARY OF THE INVENTION

The above mentioned problems with integrated circuit data transmission and other problems are addressed by the present invention and which will be understood by reading and studying the following specification. An input buffer circuit is described which equilibrates, samples, senses and latches data signals on each clock signal.

In particular, the present invention describes an input buffer circuit adapted to be coupled to a high speed data bus. The input buffer circuit comprises a differential sense amplifier circuit selectively coupled to a data input node and a data bus termination voltage. An equilibration circuit is connected to the differential sense amplifier circuit and the data bus termination voltage for equilibrating the differential sense amplifier circuit to the data bus termination voltage in response to an equilibrate signal. Coupling circuitry is provided for selectively coupling the data input node and the data bus termination voltage to the differential sense amplifier circuit in response to a sample signal. The input buffer further includes a sense amplifier activation circuitry for activating the differential sense amplifier circuit in response to a sense signal. A latch circuit is coupled to the differential sense amplifier circuit. The latch circuit is adapted to latch a data state of the differential sense amplifier circuit in response to a latch signal.

BRIEF DESCRIPTION OF THE DRAWINGS

FIGS. 8 A, B and C is a timing diagram of the operation of the input buffer of FIG. 7;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
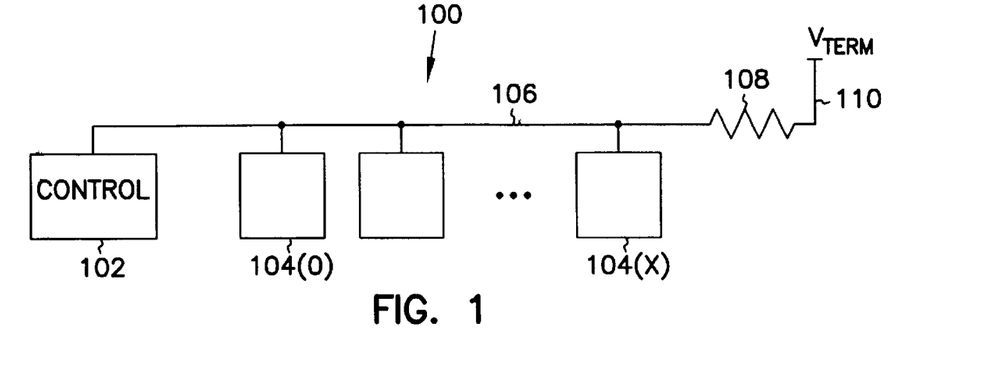
FIG. 1 is a diagram of a memory bus.

FIG. 1 is a simplified illustration of a memory bus 100 which includes a control circuit 102 to provide control and data signals to a number of integrated circuits 104(0)–104(x) via a plurality of communication lines 106. The communication lines are terminated with an appropriate termination circuit 108 (generally illustrated as a resistor) coupled to a termination voltage (Vterm).

Figure 2:
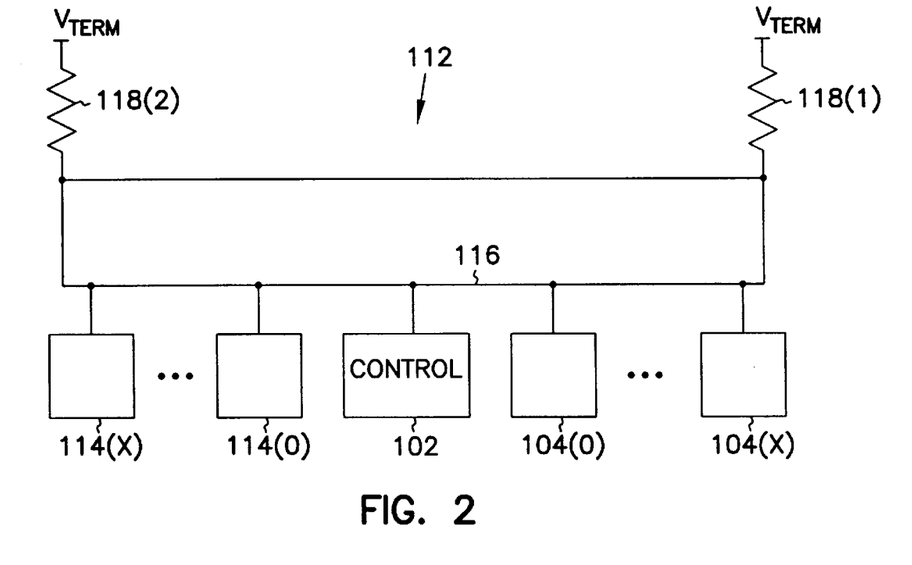
FIG. 2 is a diagram of an alternate memory bus.

FIG. 2 is a simplified illustration of a memory bus 112 which includes a centrally located control circuit 102 to provide control and data signals to a number of integrated circuits 104(0)–104(x), and 114(0)–114(x) via a plurality of communication lines 116. The communication lines are terminated at both ends with an appropriate termination circuit 118(1) and 118(2) (generally illustrated as a resistor)

coupled to a termination voltage (Vterm). The preferred value of Vterm is ½(Vdd-Vss), but can be any mid-supply level.

Figure 3:
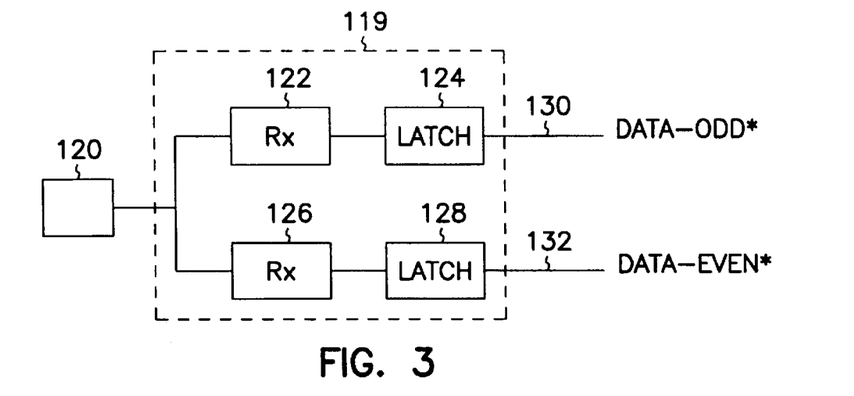
FIG. 3 is a block diagram of a dual receiver input buffer circuit.

FIG. 3 is a block diagram of an input buffer 119 connected to a data input 120. The buffer includes two receivers circuits 122 and 126 connected in parallel and two latch circuits 124 and 128. Each latch circuit produces a data output on either node 130 (Data-odd*) or node 132 (Data-even*). The receivers operate off different phases of a common data clock signal provided on a bus line. The receivers, therefore, are not edge triggered, but are controlled using internal vernier delays. The vernier delays are adjusted at system startup to maximize valid data receipt. That is, the delays are adjusted so that data sampling is conducted when valid data is present and not limited to an edge transition of a clock signal. The dual receiver input buffer illustrated can be used for high speed data communication in the range of 800+ mega bits per second. For slower data communication rates, such as 400 mega bits per second, a single receiver and latch circuit can be used in the input buffer.

Figure 4:
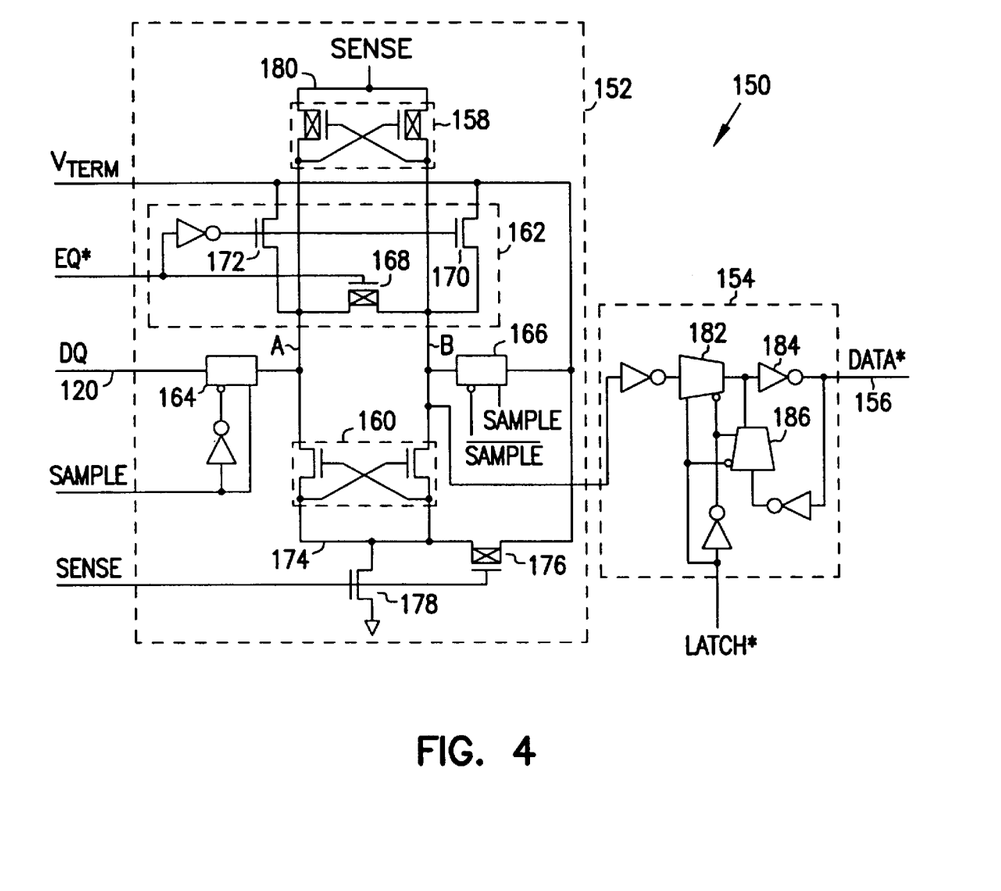
FIG. 4 is a schematic diagram of a single receiver high speed input buffer.

Referring to FIG. 4, a high speed input buffer 150 is described which uses a receiver 152 and a latch circuit 154 to produce an internal data signal (Data) on output 156. The receiver 152 circuit operates in response to internal signals which are based upon different phases of a common clock signal provided on a bus coupled to other integrated circuits. The internal signals are an equilibrate signal (EQ*), a sense signal (Sense), and a sample signal (Sample). The receiver is connected to the bus termination voltage (Vterm) and is connected to the bus data line through data input connection 120.

The receiver 152 is comprised of a p-type sense amplifier circuit 158 having a pair of cross coupled p-type transistors, and an n-type sense amplifier 160 having a pair of cross coupled n-type transistors. An equilibrate circuit 162 is provided to equilibrate the common nodes of the sense amplifiers (nodes A and B) to Vterm. Coupling circuitry 164 and 166 is provided to selectively couple node 120 and Vterm to nodes A and B, respectively, in response to the Sample signal. To better understand the operation of the input buffer, reference is made to the timing diagram of FIG. 5.

Figure 5:
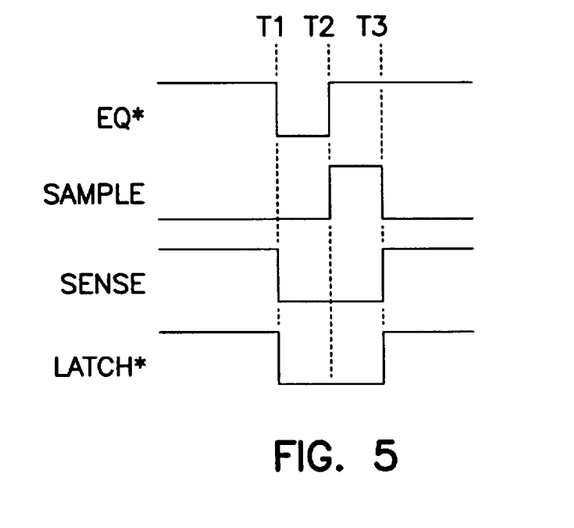
FIG. 5 is a timing diagram of the operation of the input buffer of FIG. 4.

As illustrated in FIG. 5, the equilibrate signal (EQ*) transitions low at time t1 to activate transistors 168, 170 and 172 of the equilibrate circuit 162. Transistors 170 and 172 couple nodes B and A, respectively, to the termination voltage, Vterm. The sense amplifiers, therefore, are equilibrated to the bus termination voltage. At time t2, the equilibration circuitry is deactivated, and the Sample signal transitions high and activates coupling circuit 164 to couple input 120 to node A. Couple circuit 166, likewise, is activated to couple node B to the termination voltage, Vterm. With the Sense signal low at time t2, node 180 of the p-sense amplifier circuit 158 is coupled low, and node 174 of the n-sense amplifier is coupled to Vterm through transistor 176. At time t3, the Sense signal transitions high to activate transistor 178 and couple node 174 to ground. The Sample signal transitions low to isolate nodes A and B such that p-sense amplifier and n-sense amplifier amplify nodes A and B to an appropriate voltage level. The Latch* signal transitions high at time t3 to activate latch circuit 154. Thus, coupling circuit 182 is activated to couple the inverse of node B to inverter circuit 184. When the Latch* signal returns to a low state, circuit 182 is deactivated and circuit 186 is activated to latch inverter 184. Although the latch is connected to node B, latch circuit 154 can be coupled to node A and is not intended to limited the present invention.

It will be understood by those skilled in the art that the signals illustrated in FIG. 5 are internally generated in response to an externally received clock signal. Thus, the input data buffer is operated off different phases of the clock signal.

Figure 6:
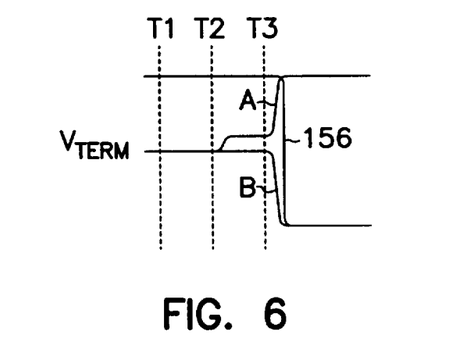
FIG. 6 is a timing diagram of select voltages of the input buffer of FIG. 4.

FIG. 6 illustrates the voltages on nodes A and B and the output node 156 upon receipt of a high input data signal. At time t1 Nodes A and B are equilibrated to Vterm. At time t2, node A is coupled to input 120 and increases in voltage. At time t3, the sense amplifier circuitry is activated and nodes A and B are amplified. At the same time, node B is coupled to the latch circuit and the output data signal on 156 is coupled to node B.

Figure 7:
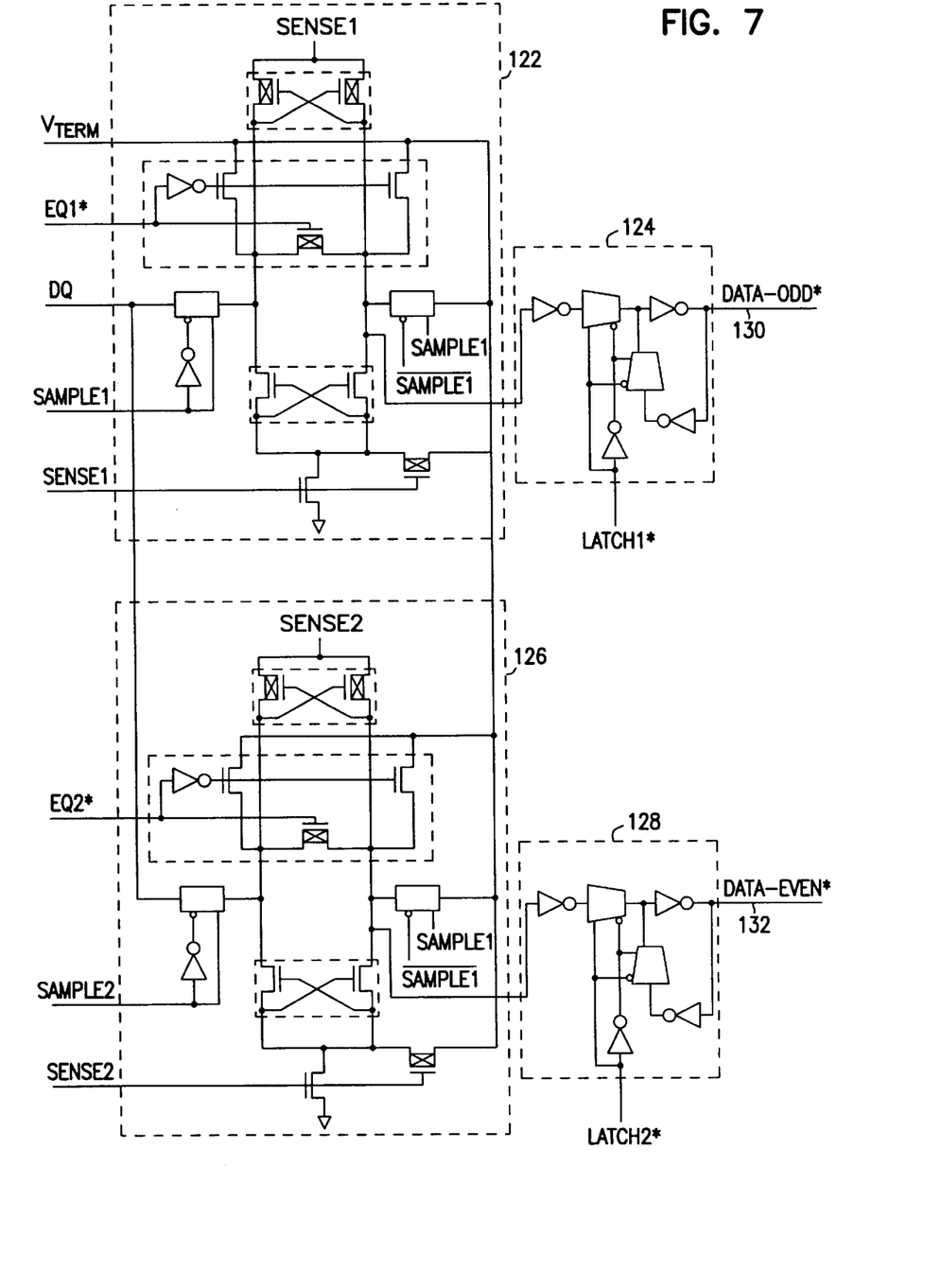
FIG. 7 is a schematic diagram of an alternate high speed input buffer.
Figure 8A:
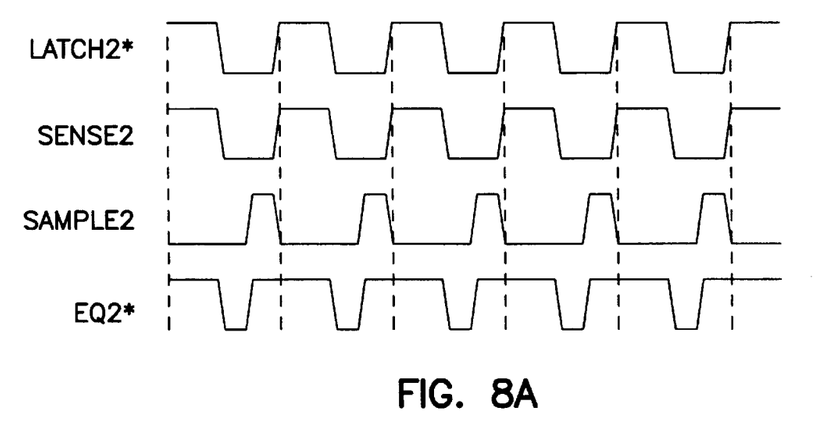
Figure 8B:
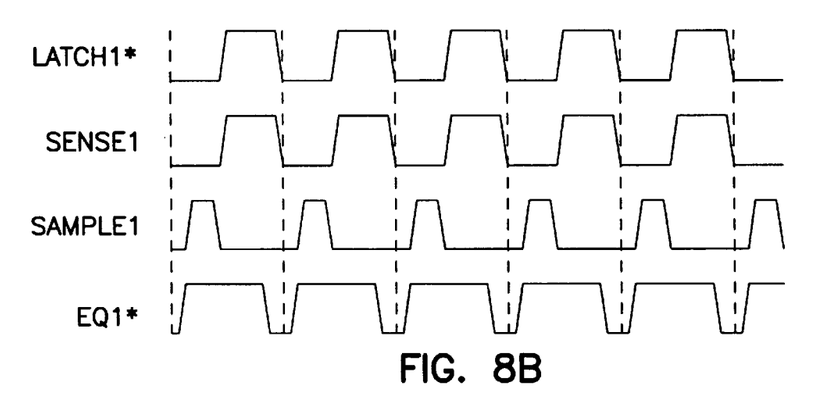
Figure 8C:
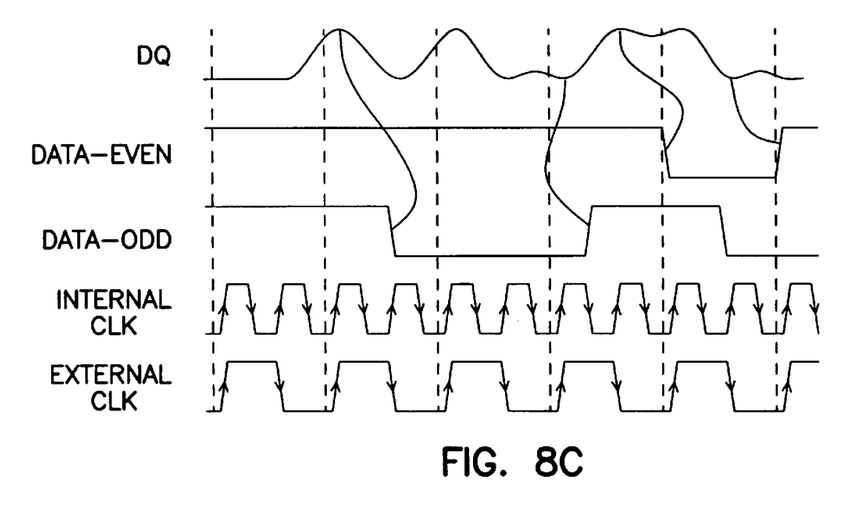

FIG. 7 is a schematic diagram of a high speed input buffer having two parallel receivers 122 and 126, and two latch circuits 124 and 128, as illustrated in FIG. 3. The receivers 122 and 126 generally include the circuitry of receiver 152 and operate in a similar manner, as described above with reference to FIG. 4. The timing diagram of FIGS. 8A, 8B and 8C illustrate the operation of the high speed input buffer of FIG. 7. The data signal provide on the DQ line is sampled by both receivers 122 and 126 on the rising edge of their respective sample signals. The DQ line, therefore, is sampled by both receiver circuits. The outputs (Data-even* and Data-odd*) together represent the data provided on the DQ line. The external bus clock signal and an internal clock signal operating at twice the frequency of the external clock are illustrated. The equilibrate signals (EQ1* and EQ2*) are substantially aligned with the clock signals. As such the external clock signal can be defined logically as being equal to ½(EQ1* AND EQ2*). The sample signals are timed using the vernier delay circuit to sample the DQ line when the data signals are at a signal peak.

Figure 9:
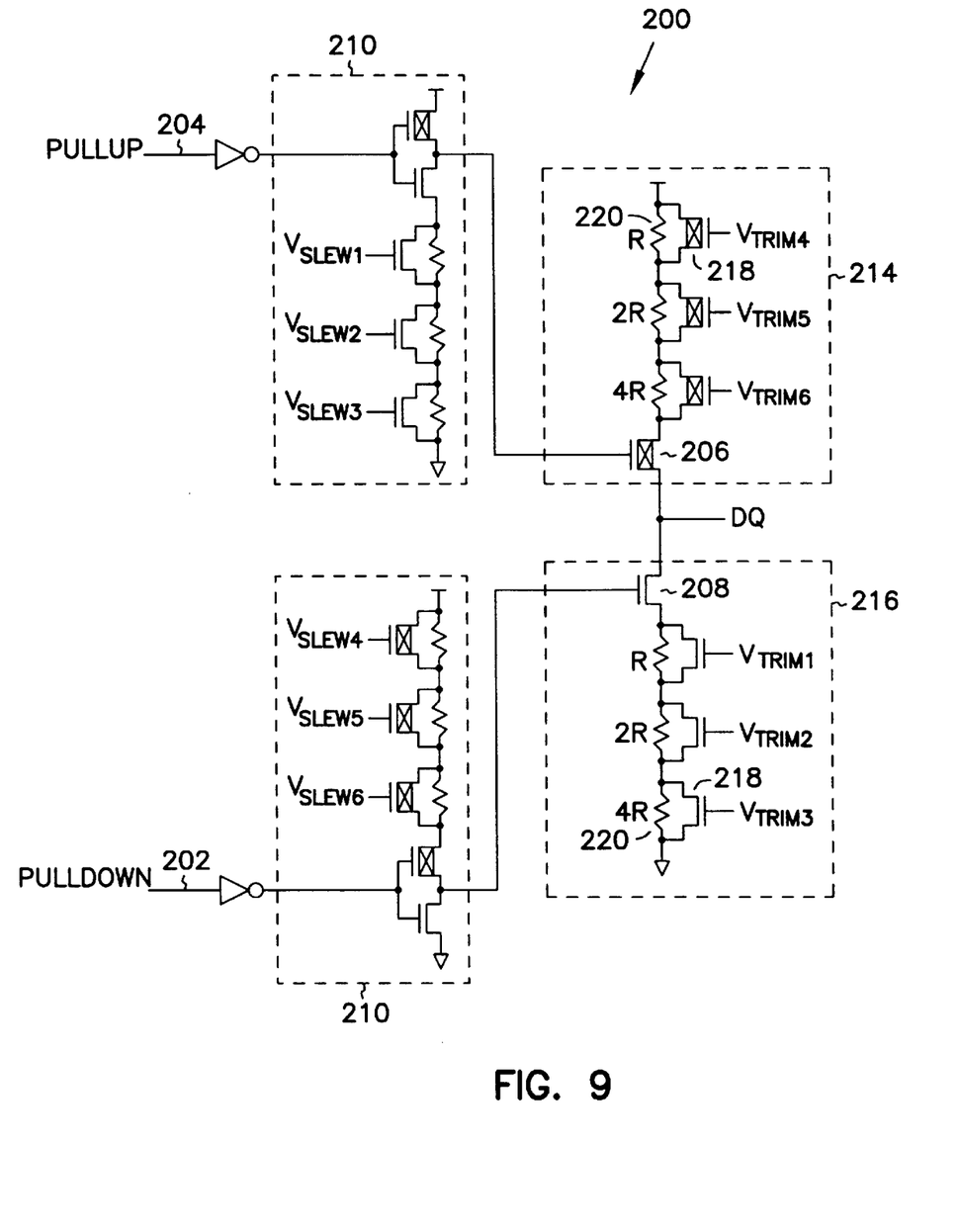
FIG. 9 is a schematic diagram of an output driver circuit.

FIG. 9 is a schematic diagram of a push/pull output driver 200 connected to the data output connections (DQ) of the integrated circuit. Pullup and pulldown signals are respectively provided on nodes 202 and 204 to activate either pullup transistor 206, or pulldown transistor 208. The driver circuit is provided with optional slew rate control circuits 210. These control circuits can be adjusted using Vslew signals to selectively activate a series of transistors. That is, by activating any of the transistors the parallel resistor is bypassed and the response time of the circuit is changed. Thus, the activation timing of transistors 206 and 208 can be adjusted.

Pullup drive adjust circuit 214 is provide in the output driver circuit 200 to adjust the voltage coupled to pullup transistor 206. Likewise, pulldown drive adjust circuit 216 is provide in the output driver circuit 200 to adjust the voltage coupled to pulldown transistor 206. In operation, the gates of transistors 218 are selectively activated to bypass resistors 220. Adjusting the output driver circuit is conducted after an integrated circuit has been installed on a bus. That is, the output driver voltages can be adjusted to match the requirements of a specific bus system. It will be appreciated by those skilled in the art that the slew rate control circuits can be eliminated without departing from the present invention.

Figure 10:
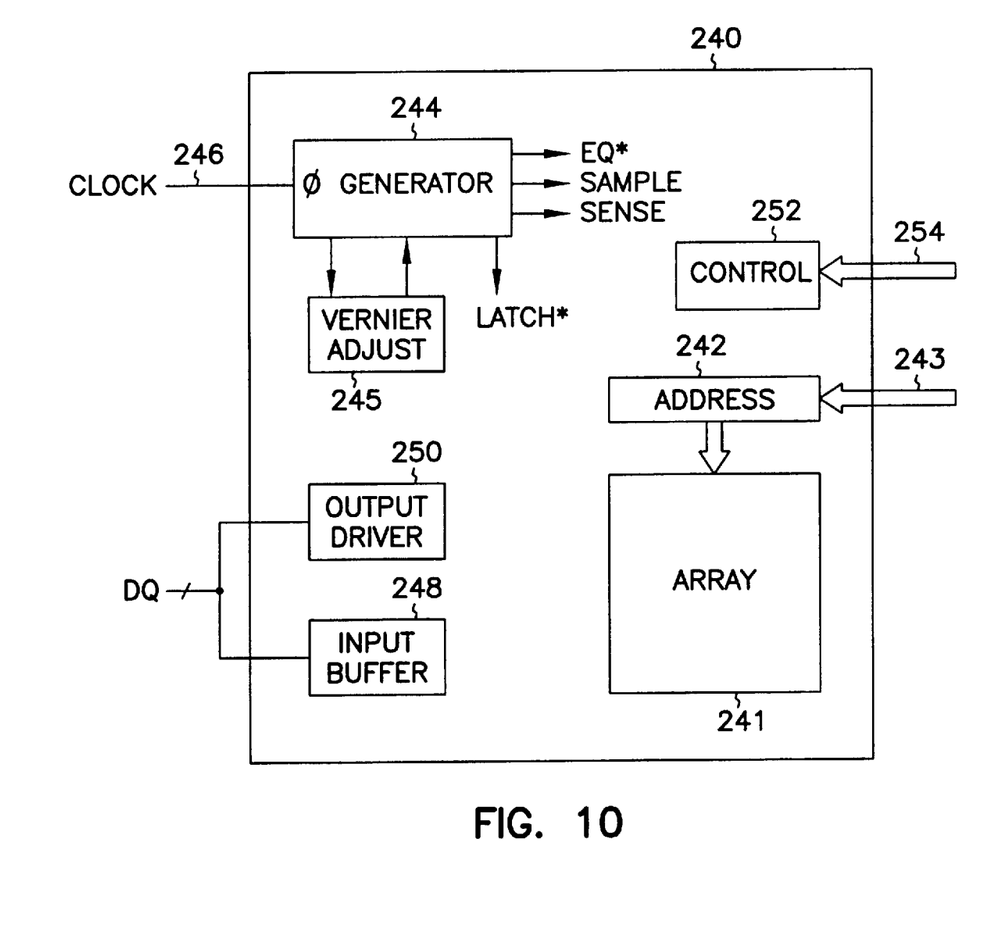
FIG. 10 is a block diagram of a memory device incorporating a high speed input buffer.

FIG. 10 is a block diagram of a dynamic random access memory device 240 (DRAM) incorporating a high speed input buffer 248, as described above. The memory includes address circuitry 242 for accessing a memory array 241 in response to address signals provided on input lines 243. Control circuitry 252 is provided for controlling the read and write operations of the memory in response to control signals 254. A phase generator circuit 244 is provided to generate internal signals DQ*, Sample, Sense, and Latch* for the input buffer circuit. Vernier adjust circuit 245 is coupled to the phase generator for adjusting the timing of the internal signals. It will be understood that the input buffer circuit 248 includes a high speed input buffer circuit as described above for each data line, DQ. Output driver circuitry 250 is provided to drive an appropriate output signal on the DQ lines. Although the illustrative example of FIG. 10 is a DRAM, the high speed input buffer circuitry of the present invention can be included in any integrated circuit device, such as SRAM and ROM memory devices.

CONCLUSION

An integrated circuit input buffer circuit is described which uses a receiver circuit and a latch to sample and latch a data signal. The buffer is operated in response to internal signals generated at different phases of an externally provided clock signal. The input buffer can include two receiver circuits and two latch circuits for use on a data bus operating at higher transmission rates. The receiver circuit includes a sensing circuit for sensing an input data signal, an equilibrate circuit for equilibrating the sensing circuit, and an sense activation circuit for activating the sensing circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An input buffer circuit adapted to be coupled to a high speed data bus, the input buffer circuit comprising:

a differential sense amplifier circuit selectively coupled to a data input node and a data bus termination voltage;

an equilibration circuit connected to the differential sense amplifier circuit and the data bus termination voltage for equilibrating the differential sense amplifier circuit to the data bus termination voltage in response to an equilibrate signal;

coupling circuitry for selectively coupling the data input node and the data bus termination voltage to the differential sense amplifier circuit in response to a sample signal;

sense amplifier activation circuitry for activating the differential sense amplifier circuit in response to a sense signal; and a latch circuit coupled to the differential sense amplifier circuit, the latch circuit adapted to latch a data state of the differential sense amplifier circuit in response to a latch signal.

2. The input buffer circuit of claim 1 wherein the equilibration circuit comprises:

a transistor having a gate coupled to the equilibration signal, and a source connected to a first sensing node of the sense amplifier and a drain connected to a second sensing node of the sense amplifier.

3. An integrated circuit comprising an input buffer adapted to be coupled to a high speed data bus, the input buffer circuit comprising:

first and second receiver circuits, each receiver circuit comprising:

a differential sense amplifier circuit selectively coupled to a data input node and a data bus termination voltage, an equilibration circuit connected to the differential sense amplifier circuit and the data bus termination voltage for equilibrating the differential sense amplifier circuit to the data bus termination voltage in response to an equilibrate signal, coupling circuitry for selectively coupling the data input node and the data bus termination voltage to the differential sense amplifier circuit in response to a sample signal, and sense amplifier activation circuitry for activating the differential sense amplifier circuit in response to a sense signal;

a first latch circuit coupled to the differential sense amplifier circuit of the first receiver circuit, the first latch circuit adapted to latch a data state of the first receiver circuit in response to a latch signal; and a second latch circuit coupled to the differential sense amplifier circuit of the second receiver circuit, the second latch circuit adapted to latch a data state of the second receiver circuit in response to a latch signal.

4. The integrated circuit of claim 3 further comprising:

a clock input node for receiving an externally provided clock signal;

a phase generation circuit connected to the clock input node, the phase generation circuit producing the equilibrate signal, the sample signal, sense signal and the latch signal coupled to both the first and second receiver circuits.

5. The integrated circuit of claim 4 wherein the integrated circuit is a dynamic random access memory (DRAM).

6. The integrated circuit of claim 3 further comprising an output driver circuit coupled to the high speed data bus, the output driver circuit comprising:

a pullup transistor connected to a data output node, and adapted to be activated in response to a pullup signal;

a pulldown transistor connected to the output node, and adapted to be activated in response to a pulldown signal;

a pullup drive adjust circuit connected between the pullup transistor and an upper voltage level node; and a pulldown drive adjust circuit connected between the pulldown transistor and a lower voltage level node.

7. The integrated circuit of claim 6 further including slew rate control circuitry for controlling the activation of the pullup and pulldown transistors.

8. The integrated circuit of claim 3 wherein the termination voltage is one-half of the difference between an upper supply voltage (Vdd) and a lower supply voltage (Vss).

9. A memory device adapted to be coupled to a high speed data bus comprising:

a clock input node for receiving an externally provided clock signal;

a first receiver circuit comprising:

a differential sense amplifier circuit selectively coupled to a data input node and a data bus termination voltage, an equilibration circuit connected to the differential sense amplifier circuit and the data bus termination voltage for equilibrating the differential sense amplifier circuit to the data bus termination voltage in response to a first equilibrate signal, coupling circuitry for selectively coupling the data input node and the data bus termination voltage to the differential sense amplifier circuit in response to a first sample signal, and sense amplifier activation circuitry for activating the differential sense amplifier circuit in response to a first sense signal;

a first latch circuit coupled to the differential sense amplifier circuit of the first receiver circuit, the first latch circuit adapted to latch a data state of the first receiver circuit in response to a first latch signal; and a phase generation circuit connected to the clock input node, the phase generation circuit adapted to produce the first equilibrate signal, the first sample signal, the first sense signal and the first latch signal.

10. The memory device of claim 9 further comprising an output driver circuit coupled to the data bus, the output driver circuit comprising:

a pullup transistor connected to a data output node, and adapted to be activated in response to a pullup signal;

a pulldown transistor connected to the output node, and adapted to be activated in response to a pulldown signal;

a pullup drive adjust circuit connected between the pullup transistor and an upper voltage level node; and a pulldown drive adjust circuit connected between the pulldown transistor and a lower voltage level node.

11. The memory device of claim 9 further comprising:

a second receiver circuit comprising:
   a differential sense amplifier circuit selectively coupled to a data input node and a data bus termination voltage,
   an equilibration circuit connected to the differential sense amplifier circuit and the data bus termination voltage for equilibrating the differential sense amplifier circuit to the data bus termination voltage in response to a second equilibrate signal,
   coupling circuitry for selectively coupling the data input node and the data bus termination voltage to the differential sense amplifier circuit in response to a second sample signal, and
   sense amplifier activation circuitry for activating the differential sense amplifier circuit in response to a second sense signal; and a second latch circuit coupled to the differential sense amplifier circuit of the second receiver circuit, the second latch circuit adapted to latch a data state of the second receiver circuit in response to a second latch signal;

the phase generation circuit further adapted to produce the second equilibrate signal, the second sample signal, the second sense signal and the second latch signal.

12. The memory device of claim 9 wherein the memory device is a dynamic random access memory (DRAM).

13. A data communication system comprising:

a bus having a plurality of communication lines, the communication lines terminated with a termination circuit and a termination voltage;

a control circuit connected to the communication lines; and a plurality of memory devices connected to the communication lines, the memory devices having a data communication input connected to receive data signals provided on one of the communication lines, the memory devices comprising:

a differential sense amplifier circuit selectively coupled to the data communication input and the termination voltage;

an equilibration circuit connected to the differential sense amplifier circuit and the termination voltage for equilibrating the differential sense amplifier circuit to the termination voltage in response to an equilibrate signal;

coupling circuitry for selectively coupling the data communication input and the termination voltage to the differential sense amplifier circuit in response to a sample signal;

sense amplifier activation circuitry for activating the differential sense amplifier circuit in response to a sense signal; and a latch circuit coupled to the differential sense amplifier circuit, the latch circuit adapted to latch a data state of the differential sense amplifier circuit in response to a latch signal.

14. The data communication system of claim 13 wherein the termination circuit is a resistor and the termination voltage is one-half of the difference between an upper supply voltage (Vdd) and a lower supply voltage (Vss).

15. The data communication system of claim 13 wherein the plurality of memory devices are dynamic random access memories (DRAM).

16. A memory device comprising:

an input node for receiving data signals;

a receiver circuit selectively coupled to the input node, the receiver circuit comprising:

a differential sense amplifier having first and second p-type transistors, the first p-type transistor having a drain connected to receive a sense signal, a source connected to a first sensing node of the sense amplifier, and a gate connected to a source of the second p-type transistor, the second p-type transistor having a drain connected to receive the sense signal, a source connected to a second sensing node of the sense amplifier, and a gate connected to the source of the first p-type transistor, the differential sense amplifier further having first and second n-type transistors, the first n-type transistor having a drain connected to a sense circuit, a source connected to the first sensing node of the sense amplifier, and a gate connected to a source of the second n-type transistor, the second n-type transistor having a drain connected to the sense circuit, a source connected to a second sensing node of the sense amplifier, and a gate connected to the source of the first n-type transistor;

an equilibrate circuit connected to the first and second sensing nodes of the differential sense amplifier, the equilibrate circuit comprising a transistor having a source connected to the first sensing node of the differential sense amplifier, a drain connected to the second sensing node of the differential sense amplifier, and a gate connected to receive an equilibrate signal;

the equilibrate circuit further comprising first and second transistors connected between the first and second sensing nodes and a data bus termination voltage, the first and second transistors having a gate coupled to the equilibrate signal to selectively connect the first and second sensing nodes to the termination voltage;

the sense circuit comprising first and second sense transistors for selectively coupling the equilibrate transistors to either the termination voltage or ground potential in response to a sense signal;

first coupling circuitry connected between the input node and the first sensing node for selectively coupling the data signals to the first sensing node in response to a sample signal;

second coupling circuitry connected between the termination voltage and the second sensing node for selectively coupling the termination voltage to the second sensing node in response to the sample signal; and a latch connected to the second sensing node of the sense amplifier circuit for latching a voltage provide on the second sensing node in response to a latch signal.

17. The memory device of claim 16 further comprising an output driver circuit, the output driver circuit comprising:

a pullup transistor connected to a data output node, and adapted to be activated in response to a pullup signal;

a pulldown transistor connected to the output node, and adapted to be activated in response to a pulldown signal;

a pullup drive adjust circuit connected between the pullup transistor and an upper voltage level node; and a pulldown drive adjust circuit connected between the pulldown transistor and a lower voltage level node.

18. The memory device of claim 16 wherein the data bus termination voltage is one-half of the difference between an upper supply voltage (Vdd) and a lower supply voltage (Vss).

19. The memory device of claim 16 wherein the memory device is a dynamic random access memory (DRAM).

20. A method of receiving data in an integrated circuit connected to a data bus, the data bus coupled to a termination voltage, the method comprising the steps of:

receiving a clock signal and generating an equilibrate signal, sample signal, sense signal and a latch signal;

equilibrating a differential sense amplifier having first and second sensing nodes to the termination voltage using the equilibration signal;

coupling the first sensing node to a data input connected to the data bus in response to the sample signal;

activating the differential sense amplifier with the sense signal to detect and amplify a state of the data input; and latching the amplified data input in response to the latch signal.

21. A method of receiving data in an integrated circuit connected to a data bus, the data bus coupled to a termination voltage, the method comprising the steps of:

receiving a clock signal and generating a first equilibrate signal, first sample signal, first sense signal and a first latch signal;

equilibrating a first differential sense amplifier having first and second sensing nodes to the termination voltage using the first equilibration signal;

coupling the first sensing node of the first sense amplifier to a data input connected to the data bus in response to the first sample signal;

activating the first differential sense amplifier with the first sense signal to detect and amplify a state of the data input;

latching the amplified data input in a first latch circuit in response to the first latch signal;

generating a second equilibrate signal, second sample signal, second sense signal and a second latch signal;

equilibrating a second differential sense amplifier having first and second sensing nodes to the termination voltage using the second equilibration signal;

coupling the first sensing node of the second sense amplifier to the data input connected to the data bus in response to the second sample signal;

activating the second differential sense amplifier with the second sense signal to detect and amplify a state of the data input; and latching the amplified data input in a second latch circuit in response to the second latch signal.

* * * * *